(12) United States Patent
Arai et al.

(10) Patent No.: US 6,448,580 B1
(45) Date of Patent: *Sep. 10, 2002

(54) SELF-LIGHT-EMITTING APPARATUS AND SEMICONDUCTOR DEVICE USED IN THE APPARATUS

(75) Inventors: Michio Arai, Tokyo; Yukio Yamauchi, Kanagawa, both of (JP)

(73) Assignees: TDK Corporation, Tokyo (JP); Semiconductor Energy Laboratory Co., Ltd., Kanagawa (JP)

( * ) Notice: Subject to any disclaimer, the term of this patent is extended or adjusted under 35 U.S.C. 154(b) by 61 days.

This patent is subject to a terminal disclaimer.

(21) Appl. No.: 09/663,844

(22) Filed: Sep. 15, 2000

Related U.S. Application Data

(62) Division of application No. 08/987,621, filed on Dec. 9, 1997.

(30) Foreign Application Priority Data

Mar. 7, 1997 (JP) ................................................. 9-53243

(51) Int. Cl.[7] .................... H01L 29/04; H01L 31/036; H01L 29/76; H01L 29/94
(52) U.S. Cl. .................... 257/72; 257/291; 257/382; 257/383; 257/420
(58) Field of Search ................... 257/290–292, 257/13, 20, 21, 70, 59, 72

(56) References Cited

U.S. PATENT DOCUMENTS

| | | |
|---|---|---|
| 5,049,975 A | 9/1991 | Ajika et al. .................... 357/71 |
| 5,221,853 A | 6/1993 | Joshi et al. .................... 257/384 |
| 5,536,951 A | 7/1996 | Muragishi .................... 257/69 |
| 5,640,067 A | 6/1997 | Yamauchi et al. |
| 5,679,981 A | 10/1997 | Kuwajima .................... 257/752 |
| 5,684,365 A | 11/1997 | Tang et al. .............. 315/169.3 |
| 5,744,824 A | 4/1998 | Kousai et al. ................. 257/74 |
| 5,773,844 A | 6/1998 | Kawamura et al. ........... 257/57 |
| 5,804,862 A | 9/1998 | Matumoto .................... 257/396 |
| 5,804,878 A | 9/1998 | Miyazaki et al. ........... 257/764 |
| 5,808,315 A * | 9/1998 | Murakami et al. ............ 257/59 |
| 6,031,290 A * | 2/2000 | Miyazaki et al. ........... 257/764 |
| 6,160,272 A * | 12/2000 | Araii et al. .................... 257/72 |
| 6,320,224 B1 * | 11/2001 | Zhang ......................... 257/347 |

* cited by examiner

Primary Examiner—Eddie Lee
Assistant Examiner—Jesse A Fenty
(74) Attorney, Agent, or Firm—Arent Fox Kintner Plotkin & Kahn PLLC

(57) ABSTRACT

The present invention relates to a semiconductor device formed in a self-light-emitting apparatus having a substrate and a plurality of self-light-emitting elements formed on the substrate, the semiconductor device being used to drive one of the self-light-emitting elements. The semiconductor device includes an active layer of semiconductor material, in which a source region and a drain region are formed, a source electrode having a multi-layered structure including an upper side layer of titanium nitride and a lower side layer of a high melting point metal having low resistance, the source electrode electrically being coupled to the source region, a drain electrode having a multi-layered structure including an upper side layer of titan nitride and a lower side layer of a high melting point metal having low resistance, the source electrode electrically being coupled to said drain region, an insulation layer formed on the active layer, and a gate electrode formed on the insulation layer.

13 Claims, 6 Drawing Sheets

SELF-LIGHT-EMITTING APPARATUS AND SEMICONDUCTOR DEVICE USED IN THE APPARATUS

This application is a division of U.S. appl. Ser. No. 08/987,621, filed Dec. 9, 1997.

FIELD OF THE INVENTION

The present invention relates to a self-light-emitting apparatus, such as for example, an organic or inorganic electroluminescence (EL) display device and the like and a semiconductor device, such as a thin film transistor (TFT) used in the apparatus.

DESCRIPTION OF THE RELATED ART

In an organic EL display device, many of organic EL elements are arranged in matrix on a substrate. Each of the EL elements, namely a pixel (picture element), consists of a transparent electrode layer, an organic EL layer and an upper electrode layer. At least one thin film transistor for controlling current applied to the EL element is electrically connected to this EL element.

In such an active matrix type organic EL display device, a connecting line from an X-direction peripheral drive circuit, a connecting line from a Y-direction peripheral drive circuit and a connecting line from a power supply (Vdd) are certainly intersected to each other. Thus, the intersected portions of these connecting lines should have a multi-layered structure of two or more layers through insulation interlayer(s) so that they are not short-circuited to each other.

In this multi-layered structure, a connecting line (a lower layer line) which is a lower side layer is connected to a silicon active layer or gate electrode silicon layer of a thin film transistor at the lower surface thereof, and is connected to an upper side electrode line or a transparent electrode of a EL pixel at the upper surface thereof.

Therefore, in addition to a low electric resistance, a material of the lower layer line should have a function as a barrier metal to prevent the diffusion of silicon into an aluminum line, and a function that the material is not damaged during etching of a insulation interlayer to form a contact hole, namely a chemical resistance which is not etched by ammonium fluoride during wet etching and a sufficient selection ratio (ratio of the etching rates) for the insulation interlayer during an dry etching. Further, the material of the lower layer line should also be able to perform an electrically stable connection to the upper side electrode line.

It is also required that the material of the lower layer line does not generate a hillock by thermal stress applied during depositing the insulation interlayer, that is a projected portion of the material is not formed by being crystallized. Additionally, the material should also be able to perform an electrically stable connection to a transparent electrode made of a material such as ITO (Indium Tin Oxide) or the like which is apt to react with other materials.

In a TFT for an organic EL display device, which the present inventor et al of the present application developed, although not forming a prior art for the present invention, titanium nitride containing equal to or less than 50 atm % of nitrogen is used as a material with these functions (U.S. Pat. No. 5,640,067).

Titanium nitride has a relatively large resistance (Specific resistance is equal to or more than 90 $\mu\Omega\cdot$cm, and sheet resistance is equal to or more than 5 $\Omega/\square$). Thus, titanium nitride is used as a material of the lower layer line of an organic EL display device, it is necessary for the film thickness to be for example 2500 Angstroms or more to lower the resistance value.

Further, it is very difficult to work titanium nitride. Thus, when a thick titanium nitride film is worked by dry etching, the working time is long and damage to portions other than titanium nitride is increased, and further short-circuit easily occurs due to a remaining titanium nitride film on a stepped sidewall portion. This often results in electrical defects.

Alternatively, when the thick titanium nitride film is worked by wet etching, problems of damage due to the etching and of the remaining titanium nitride film on the stepped side wall portion do not occur. Nevertheless, it was impossible to obtain miniaturization and high resolution of an organic EL display apparatus with a specification better than currently being used.

As mentioned above, when titanium nitride is used, it was impossible to obtain miniaturization and high resolution of an organic EL display device with a specification better than currently being used.

SUMMARY OF THE INVENTION

Therefore it is an object of the present invention to provide a self-light-emitting apparatus which is capable of further obtaining miniaturization and high resolution of a self-light-emitting apparatus, such as an organic or inorganic EL display device and the like, and a semiconductor device used in the apparatus.

It is another object of the present invention to provide a self-light-emitting apparatus using a line material in which a high reliability can be obtained.

According to the present invention, there is provided a semiconductor device formed in a self-light-emitting apparatus having a substrate and a plurality of self-light-emitting elements formed on the substrate, the semiconductor device being used to drive one of the self-light-emitting elements. This semiconductor device includes an active layer of a semiconductor material, in which a source region and a drain region are formed, a source electrode having a multi-layered structure including an upper side layer of titanium nitride and a lower side layer of a high melting point metal having low resistance, the source electrode electrically being coupled to the source region, a drain electrode having a multi-layered structure including an upper side layer of titanium nitride and a lower side layer of a high melting point metal having low resistance, the source electrode electrically being coupled to the drain region, an insulation layer formed on the active layer, and a gate electrode formed on the insulation layer.

Thus, in the present invention, a source electrode and a drain electrode which are connected to an active layer of a semiconductor device, such as a thin film transistor, is formed-of a barrier metal layer having a multi-layered structure including an upper side layer of titanium nitride and a lower side layer of a high melting point metal having low resistance. Such a barrier metal layer having a multi-layered structure has heat resistance and chemical resistance and further a stable property.

Further, the barrier metal of the present invention can more extremely reduce the specific resistance in comparison with a titanium nitride single layer. Therefore, in the present invention, essential functions of a barrier metal can be obtained, and further the connecting line can be miniaturized.

It is preferred that the high melting point metal having low resistance is a metal having specific resistance equal to or more than 10–30 $\mu\Omega$·cm and a melting point equal to or more than 800° C.

It is further preferred that the high melting point metal having low resistance is one metallic material selected from groups of tungsten, molybdenum, tantalum, titanium and nickel.

It is also preferred that the self-light-emitting apparatus is an organic or inorganic electroluminescence display device.

Further, according to the present invention, there is also provided a self-light-emitting apparatus having a substrate, a plurality of self-light-emitting elements formed on the substrate and a plurality of semiconductor devices formed on the substrate, the semiconductor devices being connected to respective the self-light-emitting elements for controlling current applied to the plurality of self-light-emitting elements.

This semiconductor device includes: an active layer of semiconductor material, in which a source region and a drain region are formed, a source electrode having a multi-layered structure including an upper side layer of titanium nitride and a lower side layer of a high melting point metal having low resistance, the source electrode electrically being coupled to the source region, a drain electrode having a multi-layered structure including an upper side layer of titanium nitride and a lower side layer of a high melting point metal having low resistance, the source electrode electrically being coupled to the drain region, an insulation layer formed on the active layer, and a gate electrode formed on the insulation layer. The self-light-emitting apparatus further includes a connecting conductor having a multi-layered structure including an upper side layer of titanium nitride for connecting each of the semiconductor devices to each of the self-light-emitting elements.

It is preferred that the high melting metal having low resistance is a metal having specific resistance equal to or more than 10–30 $\mu\Omega$·cm and a melting point equal to or more than 800° C. It is further preferred that the high melting point metal having low resistance is one metallic material selected from groups of tungsten, molybdenum, tantalum, titanium and nickel.

It is also preferred that the self-light-emitting apparatus is an organic or inorganic electroluminescence display device. In this case, it is further preferred that each of the self-light-emitting elements is an organic or inorganic electroluminescence element having a transparent electrode, and the connecting conductor having a multi-layered structure is connected to the transparent electrode.

Thus, since in order to connect the semiconductor device to the transparent electrode of the EL element, a connecting conductor having a multi-layered structure including an upper side layer of titanium nitride and a lower side layer of a high melting point metal having low resistance, the connection to the electrode, which is likely to generate electric corrosion during etching and to generate contact failure due to oxidative effect, can stably be carried out.

Further, according to the present invention, there is provided an active matrix driving type self-light-emitting apparatus having a substrate, a plurality of self-light-emitting elements formed on the substrate and a plurality of semiconductor devices formed on the substrate, the semiconductor devices being connected to respective the self-light-emitting elements for controlling current applied to the plurality of self-light-emitting elements.

This self-light-emitting apparatus includes an insulation interlayer, and an upper side conductor layer and a lower side conductor layer intersecting to each other through the insulation interlayer, the upper side conductor layer being formed of aluminum material, and the lower side conductor layer being a conductor layer having a multi-layered structure including an upper side layer of titanium nitride and a lower side layer of a high melting point metal having low resistance.

It is preferred that the high melting metal having low resistance is a metal having specific resistance equal to or more than 10–30 $\mu\Omega$·cm and a melting point equal to or more than 800° C. Further, the high melting point metal having low resistance is one metallic material selected from groups of tungsten, molybdenum, tantalum titanium and nickel.

It is also preferred that the self-light-emitting apparatus is an organic or inorganic electroluminescence display device.

Further objects and advantages of the present invention will be apparent from description of the preferred embodiments of the invention as illustrated in the accompanying drawings.

DESCRIPTION OF THE PREFERRED EMBODIMENTS

Figure 1:
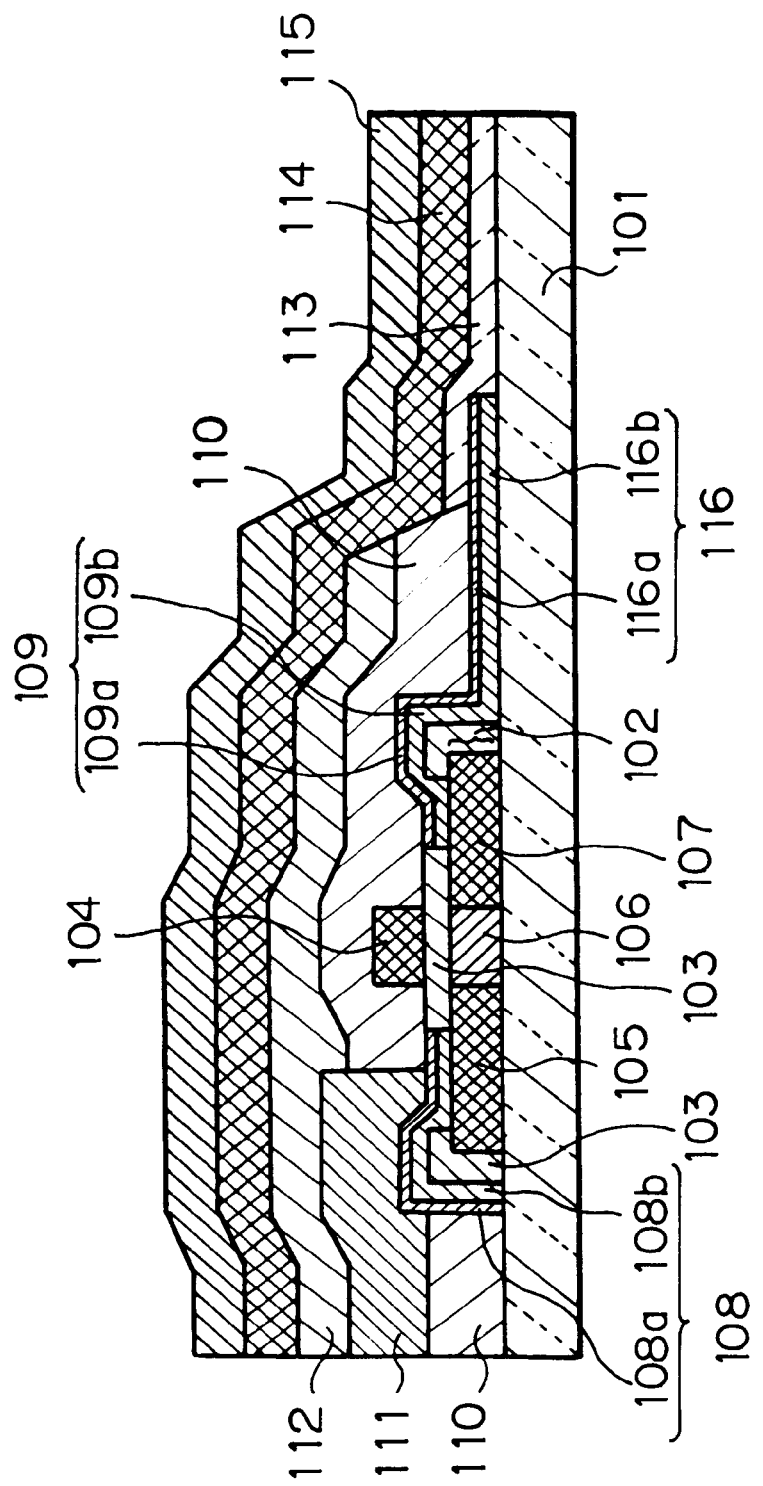
FIG. 1 shows a sectional view of a preferred embodiment of an EL element of an organic EL display device and a current control TFT (thin film transistor) portion.

FIG. 1 shows a constitution of an organic electroluminescence (EL) element and a current control thin film transistor for controlling current applied to the EL element in a preferred embodiment of an organic EL display device according to the present invention.

In FIG. 1, a reference numeral 101 denotes a transparent substrate such as a quartz substrate. On the substrate 101, many of the organic EL elements and their peripheral circuit elements such as current control thin film transistors, switching thin film transistors for switching the respective current control transistors, another thin film transistors which constitute peripheral driving circuits and capacitors are formed.

Each of the current control thin film transistors is substantially constituted by a P type active silicon layer 102 formed on the substrate 101, a gate oxide layer 103 of $SiO_2$ formed on a central region of the active silicon layer 102, a gate electrode 104 of phosphorous doped polysilicon multi-layered on the gate oxide layer 103, a source electrode 108 which is a barrier metal layer of a multi-layered structure including an upper side layer 108a of titanium nitride and a lower side layer 108b of a high melting point metal having low resistance, a drain electrode 109 which is a barrier metal layer of a multi-layered structure including an upper side layer 109a of titanium nitride and a lower side layer 109b of a high melting point metal having low resistance, a first insulation interlayer 110 of, for example, a phospho-silicate glass and a conductive lead (upper layer line) 111 of aluminum material connected to the source electrode 108.

The gate electrode 104 can be made of aluminum material instead of the phosphorous doped polysilicon. In the active silicon layer 102, a source region 105, a channel region 106 and a drain region 107 are formed. To the source region 105 of the active silicon layer 102, the conductive lead 111 of aluminum material is electrically coupled via the source electrode 108 of a barrier metal layer. On the other hand, to the drain region 107, the drain electrode of a barrier metal layer is electrically coupled.

Each of the organic EL elements is substantially constituted by a transparent electrode 113 of, for example, ITO (Indium Tin Oxide) material formed on the substrate 101, an organic EL layer 114 formed on the transparent electrode layer 113 and an upper common electrode 115 of an organic EL element. The drain electrode 109 is extended to be a lower layer line 116 of a multi-layered structure including an upper side layer 116a of titanium nitride and a lower side layer 116b of a high melting point metal having low resistance and is connected to the transparent electrode 113 of an organic EL element. For example, a second insulation interlayer 112 of, for example, non-silicate glass material is formed between the organic EL element and upper layer line 111.

The high melting point metal having low resistance of each lower side layer of the source electrode 108, drain electrode 109 and lower layer line 116 is a metallic material having a specific resistance of 10–30 $\mu\Omega$·cm and a melting point of 800° C. or more, such as tungsten, molybdenum, tantalum, titanium or nickel. The titanium nitride of the upper side layer is one which contains 50 atm % or less of nitrogen, for example, 40 atm % of nitrogen.

Referring to FIGS. 2a to 2d, manufacturing processes of the current control thin film transistor and the organic EL element of this embodiment will be described in detail. It should be noted that manufacturing processes of the switching thin film transistor and another thin film transistors which constitute peripheral driving circuits of the EL element will be the same as following processes of the current control thin film transistor.

Figure 2A:
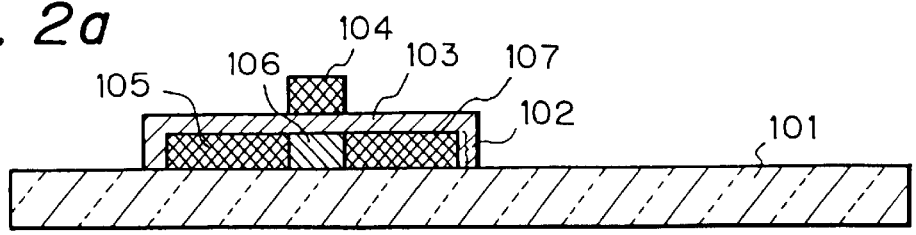
FIGS. 2a to 2d show sectional vies of a part of manufacturing steps of the current controlling TFT and organic EL element according to the embodiment shown in FIG. 1.

As shown in FIG. 2a, on a transparent substrate 101 such as a quartz substrate, a glass substrate or a ceramic substrate, an active silicon layer 102 with an island shape is formed by depositing an amorphous silicon layer by a CVD (Chemical Vapor Deposition) method, annealing the deposited amorphous silicon layer to form a polysilicon layer (solid-phase growth), and then performing patterning process of the polysilicon layer.

Then, on the active silicon layer 102, $SiO_2$ is deposited to form a gate oxide layer 103 of $SiO_2$. Thereafter, a source region 105, a channel region 106 and a drain region 107 are formed in the active silicon layer 102 by an ion doping method through this gate oxide layer 103. In this embodiment, dopant is for example phosphorus. After that, a gate electrode 104 of phosphorus doped polysilicon is formed on the channel region 106 in lamination.

Figure 2B:
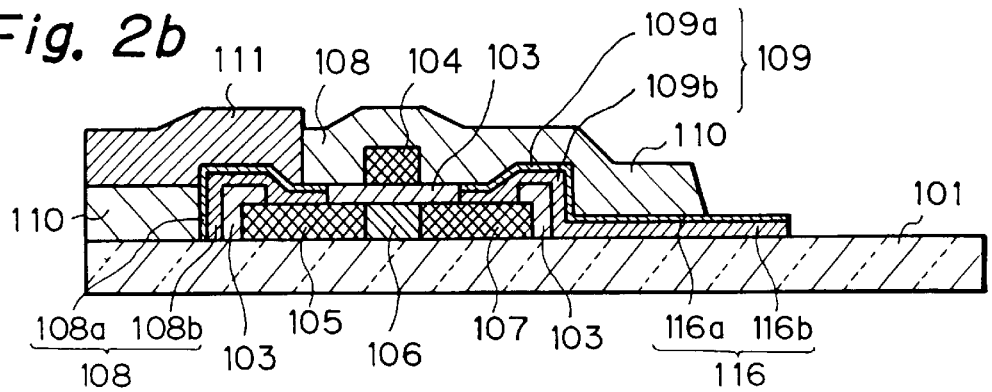

Then, as shown in FIG. 2b, an opening is formed in the source region 105, a portion (not shown in FIG. 2b) of the gate region and the drain region 107, respectively, by etching the gate oxide layer 103. A high melting point metal having low resistance in which a specific resistance is 10–30 $\mu\Omega$·cm and a melting point is 800° C. or more, such as tungsten, molybdenum, tantalum, titanium or nickel is deposited on the entire surfaces of the substrate to a thickness of 100–2000 Angstroms, for example, 1000 Angstroms by sputtering in. Then, titanium nitride is sequentially deposited on the obtained structure by sputtering. Titanium nitride which contains 50 atm % or less of nitrogen, for example, 40 atm % thereof is deposited on the entire surface of the substrate to a thickness of 50–1000 Angstroms, for example, 300 Angstroms.

Then, the multi-layered structure of the high melting point metal having low resistance and titanium nitride is dry etched in a desired shape so that a source electrode 108 of a barrier metal layer which contacts the source region 105, a drain electrode 109 of a barrier metal layer which contacts the drain region 107 and a lower layer line 116 which is extended from the drain electrode 109 to a portion on the substrate 101 are formed. Then, for example, phospho-silicate glass is deposited on the entire surface of the obtained structure to a thickness of, for example, 4000 Angstroms, as an insulation interlayer 110.

After that, parts of the insulation interlayer on such as the lower layer line 116 and the source electrode 108 are removed by etching process, and aluminum is deposited to a thickness of 5000 Angstroms to form an aluminum layer for an upper layer line. Then this aluminum layer is etched to form a required upper layer line 111.

Figure 2C:
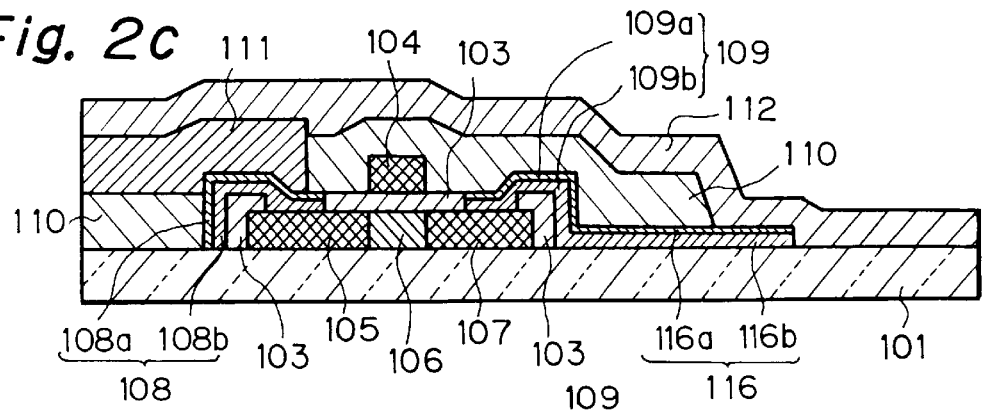

Then, as shown in FIG. 2c, for example, a non-silicate glass is deposited on the entire surface to a thickness of 300 Angstroms by a CVD process, as a second insulation interlayer 112. If necessary, by etching process, the second insulation interlayer 112 of an EL pixel forming region on the lower layer line 116 and the upper layer line 111 is removed to form an electrical contact.

Figure 2D:
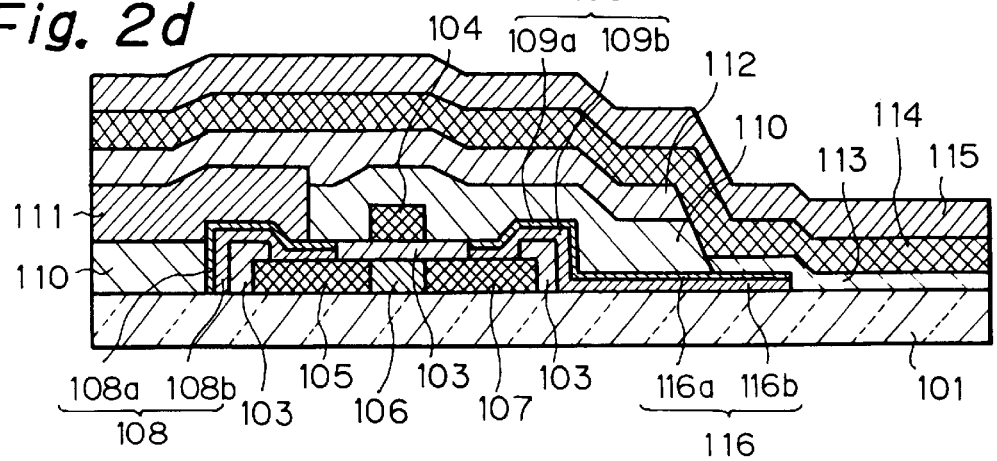

After that, as shown in FIG. 2d, an electrode material for a transparent electrode 113, for example, ITO or the like is deposited on the entire surface of the obtained structure. This transparent electrode 113 is formed in the EL pixel forming region by wet etching process so that it is connected to the lower layer line 116 which is extended from the drain electrode 109 of the current control thin film transistor. Then, an organic EL layer 114 and an upper common electrode 115 on the organic EL layer are formed on the entire surface of the pixel region by vapor deposition methods using a metal mask. The upper common electrode 115 is formed by a magnesium film including, for example, silver.

After that, as is required, on these layers a protection layer of, for example aluminum material for enhancing reliability is formed to constitute an organic EL display.

Thus, according to the embodiment, the source electrode 108 and drain electrode 109 are constituted by respective barrier metal layers of multi-layered structure including the upper side layers 108a and 109a of titanium nitride and the lower side layers 108b and 109b. Such barrier metal layer of the multi-layered structure has heat resistance and chemical resistance as well as stability. And the specific resistance of the multi-layered structure can more drastically be decreased in comparison with a titanium nitride single layer. For example, while the specific resistance of titanium nitride is 90 $\mu\Omega$·cm, the specific resistance of tungsten, molybdenum or the like is 10–30 $\mu\Omega$·cm (the specific resistance of molybdenum is a little lower than that of tungsten), which is more significantly lower than that of titanium nitride.

Therefore, according to the present invention, inherent functions can be obtained as a barrier metal, and the connection line is miniaturized or fined. As a result, miniaturization and high resolution of the organic EL apparatus can be attained.

Figure 3:
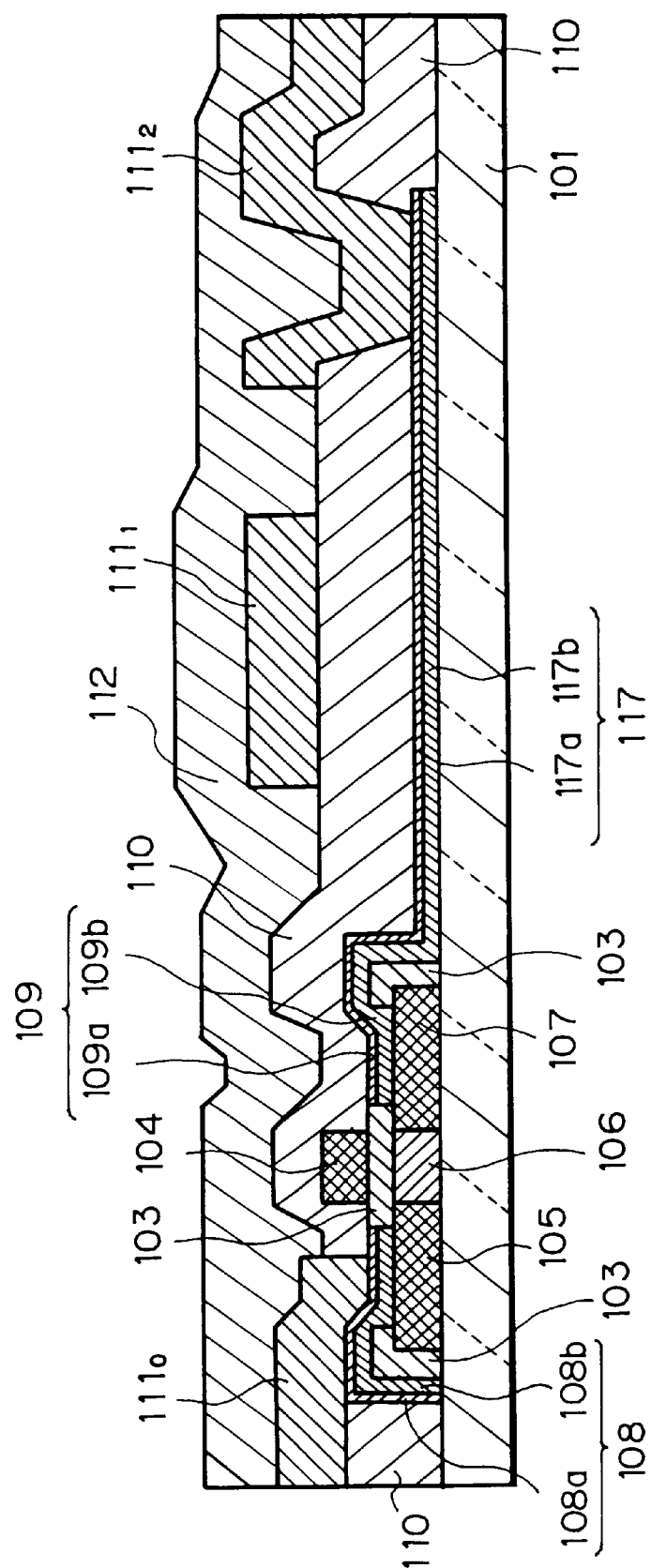
FIG. 3 shows a sectional view of another embodiment of a current control TFT portion and a lower layer line portion of an EL element of an organic EL display device according to the present invention.

FIG. 3 shows a constitution including a current control portion and lower layer portion of an EL element of an organic EL display device of another embodiment according to the present invention. In this embodiment, the same reference numerals are denoted to the same elements as in the elements in the embodiment of FIG. 1. That is the constitution of a transparent substrate 101, a source region 105, channel region 106, drain region 107, gate oxide layer 103, gate electrode 104, source electrode 108 and drain electrode 109 of a current control thin film transistor formed on the substrate 101, and an upper layer line 1110 is fully the same as in the case of the embodiment in FIG. 1. Further, effects obtained by the respective multi-layered structures of the source electrode 108 and drain electrode 109 including an upper side layer of titanium nitride and a lower side layer of a high melting point metal having low resistance are the same as in the case of the embodiment in FIG. 1.

The drain electrode 109 is extended as its original multi-layered structure so as to form a lower layer line 117 of a multi-layered structure including an upper side layer 117a of titanium nitride and a lower side layer 117b of a high melting point metal having low resistance. The high melting point metal having low resistance which constitutes the lower side layer 117b of the lower layer line 117 is a metallic material selected from groups of tungsten, molybdenum, tantalum, titanium and nickel having specific resistance of 10–30 $\mu\Omega\cdot$cm and a melting point equal to or more than 800° C. Further, titanium nitride which constitutes the upper side layer 117a is one containing nitrogen equal to or less than 50 atm %, for example, 40 atm %

The other end of the lower layer line 117 is connected to an upper layer line $111_1$ of aluminum material. On the lower layer line 117, an upper layer line $111_2$ of aluminum material is formed so as to cross the lower layer line 117 with a first insulation interlayer 110 of, for example, phospho-silicate glass material therebetween. On the upper layer lines $111_0$, $111_1$ and $111_2$, a second insulation interlayer 112 of, for example, non-silicate glass is formed.

Since the lower layer line 117 of a multi-layered structure including the upper side layer of titanium nitride and the lower side layer of high melting point metal having low resistance can simultaneously be formed together with the source electrode 108 and drain electrode 109 as in a case of the embodiment, it is not necessary to separately form the lower line 117 with aluminum material or the like, and the manufacturing cost can be deceased. Further, since the lower layer line 117 has a multi-layered structure including the upper side layer 117a of titanium nitride and the lower side layer 117b of a high melting point metal having low resistance,even if it suffers thermal stress due to the subsequent formation of an insulation interlayer and current is started, no hillock or migration occurs as in aluminum resulting in no short-circuit to the aluminum line of the upper layer line. Particularly, since a titanium nitride layer is formed on the upper side, it prevents the surface of the high melting point metal having low resistance of tungsten, molybdenum or the like on the lower side from being oxidized to generate disconnection, with the result that a high reliable device can be provided.

Figure 4:
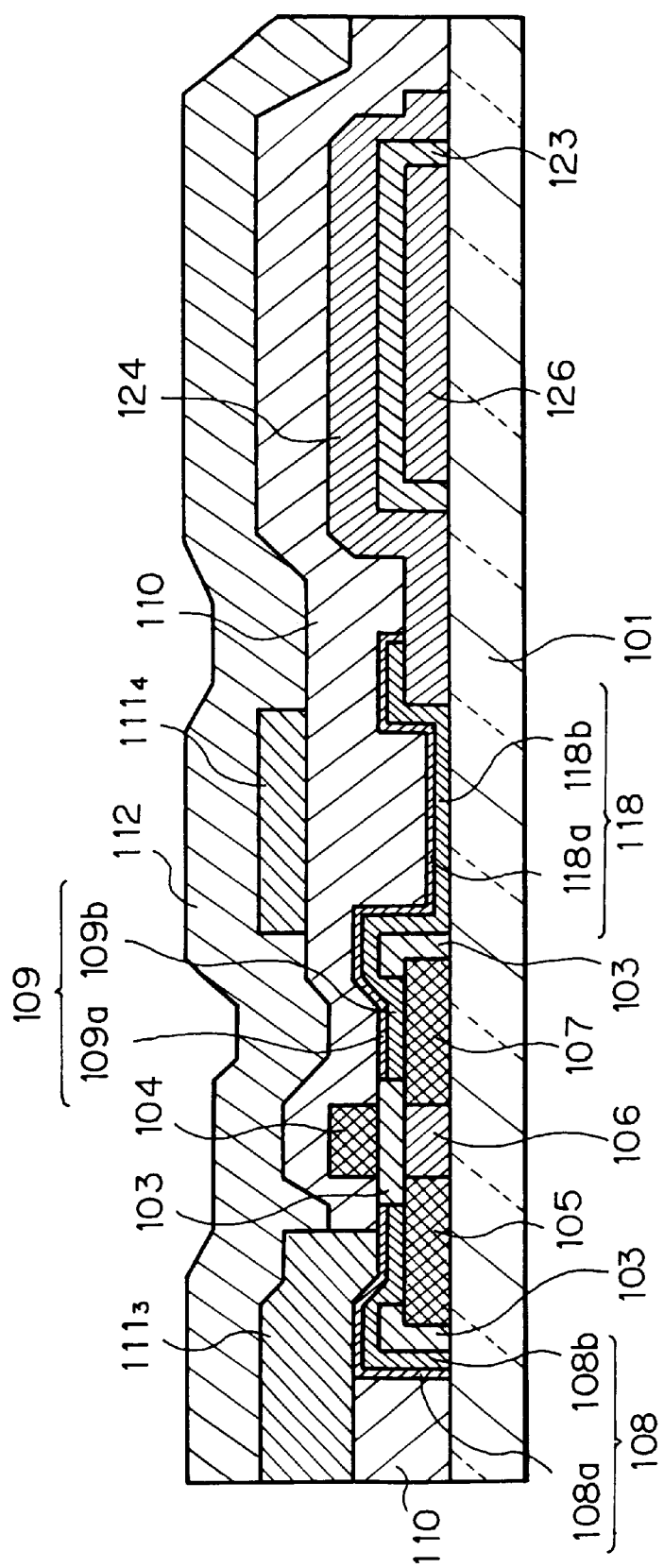
FIG. 4 shows a sectional view of another embodiment of a current control TFT portion and a lower layer line portion of an EL element of an organic EL display device according to the present invention.

FIG. 4 shows a constitution including current control and switching thin film transistor portions of an EL element of an organic EL display device of still another embodiment according to the present invention. In this embodiment, the same reference numerals are denoted to the same elements as in the elements in the embodiment of FIG. 1. That is the constitution of a transparent substrate 101, a source region 105, channel region 106, drain region 107, gate oxide layer 103, gate electrode 104, source electrode 108 and drain electrode 109 of a current control thin film transistor formed on the substrate 101, and an upper layer line $111_3$ is fully the same as in the case of the embodiment in FIG. 1. Further, effects obtained by the respective multi-layered structures of the source electrode 108 and drain electrode 109 including an upper side layer of titanium nitride and a lower side layer of a high melting point metal having low resistance are the same as in the case of the embodiment in FIG. 1.

The drain electrode 109 is extended as its original multi-layered structure so as to form a lower layer line 118 of a multi-layered structure including an upper side layer 118a of titanium nitride and a lower side layer 118b of a high melting point metal having low resistance. The high melting point metal having low resistance which constitutes the lower side layer 118b of the lower layer line 118 is a metallic material selected from groups of tungsten, molybdenum, tantalum titanium and nickel having specific resistance of 10–30 $\mu\Omega\cdot$cm and a melting point equal to or more than 800° C. Further, titanium nitride which constitutes the upper side layer 118a is one containing nitrogen equal to or less than 50 atm %, for example, 40 atm %.

The other end of the lower layer line 118 is connected to a gate electrode 124 of the switching thin film transistor. This switching thin film transistor is formed on the substrate 101 in the direction perpendicular to the current control thin film transistor in the same constitution of the current control thin film transistor. In FIG. 4, only a channel forming region 126, gate oxide layer 123 and gate electrode 124 are shown.

On the lower layer line 118, an upper layer line $111_4$ of aluminum material is formed so as to cross the lower layer line 118 with a first insulation interlayer 110 of, for example, phospho-silicate glass material therebetween. On the upper layer lines $111_3$ and $111_4$, a second insulation interlayer 112 of, for example, non-silicate glass is formed.

Since the lower layer line 118 of a multi-layered structure including the upper side layer of titanium nitride and the lower side layer of high melting point metal having low resistance can simultaneously be formed together with the source electrode 108 and drain electrode 109 as in a case of the embodiment, it is not necessary to separately form the lower line 118 with aluminum material or the like, and the manufacturing cost can be decreased. Further, since the lower layer line 118 has a multi-layered structure including the upper side layer 118a of titanium nitride and the lower side layer 118b of a high melting point metal having low resistance, even if it suffers thermal stress due to the subsequent formation of an insulation interlayer and current is started, no hillock or migration occurs as in aluminum, resulting in no short-circuit to the aluminum line of the upper layer line nor disconnection. Particularly, since a titanium nitride layer is formed on the upper side, it prevents the surface of the high melting point metal having low resistance of tungsten, molybdenum or the like on the lower side from being oxidized to generate disconnection, with the result that a high reliable device can be provided.

Figure 5:
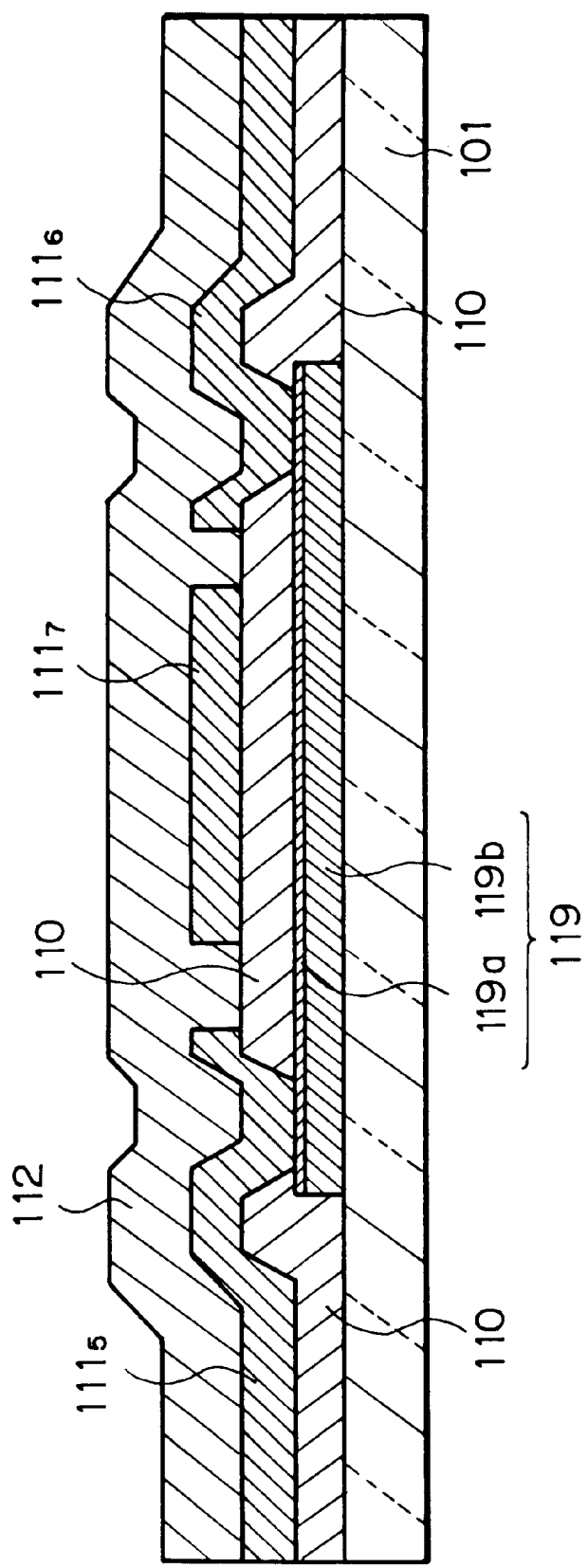
FIG. 5 shows a sectional view of still another embodiment of a current control TFT portion and a lower layer line portion of an EL element of an organic EL display device according to the present invention.

FIG. 5 shows a constitution of a lower layer line of an organic EL display device of still another embodiment according to the present invention. In this embodiment, the lower layer line 119 formed on the substrate 101 has a multi-layered structure including an upper side layer 119a of titanium nitride and a lower side layer 119b of a high melting point metal having low resistance. The high melting point metal having low resistance which constitutes the lower side layer 119b of the lower layer line 119 is a metallic material selected from groups of tungsten, molybdenum, tantalum titanium and nickel having specific resistance of 10–30 $\mu\Omega$·cm and a melting point equal to or more than 800° C. Further, titanium nitride which constitutes the upper side layer 119a is one containing nitrogen equal to or less than 50 atm %, for example, 40 atm %.

Both ends of the lower layer line 119 are connected to upper layer lines $111_5$ and $111_6$ respectively. On the lower layer line 119, an upper layer line $111_7$ of aluminum material is formed so as to cross the lower layer line 119 with a first insulation interlayer 110 of, for example, phospho-silicate glass material therebetween. On the upper layer lines $111_5$, $111_6$ and $111_7$, a second insulation interlayer 112 of, for example, non-silicate glass is formed.

Since the lower layer line 119 of a multi-layered structure including the upper side layer of titanium nitride and the lower side layer of high melting point metal having low resistance can simultaneously be formed together with the source electrode and drain electrode of a thin film transistor (not shown) having the same structure as in a case of the embodiment, it is not necessary to separately form the lower layer line 119 with aluminum material or the like, and the manufacturing cost can be decreased. Further, since the lower layer line 119 has a multi-layered structure including the upper side layer 119a of titanium nitride and the lower side layer 119b of a high melting point metal having low resistance, even if it suffers thermal stress due to the subsequent formation of an insulation interlayer and current is started, no hillock or migration occurs as in aluminum, resulting in no short-circuit to the aluminum line of the upper layer line nor disconnection. Particularly, since a titanium nitride layer is formed on the upper side, it prevents the surface of the high melting point metal having low resistance of tungsten, molybdenum or the like on the lower side from being oxidized to generate disconnection, with the result that a high reliable device can be provided.

Figure 6:
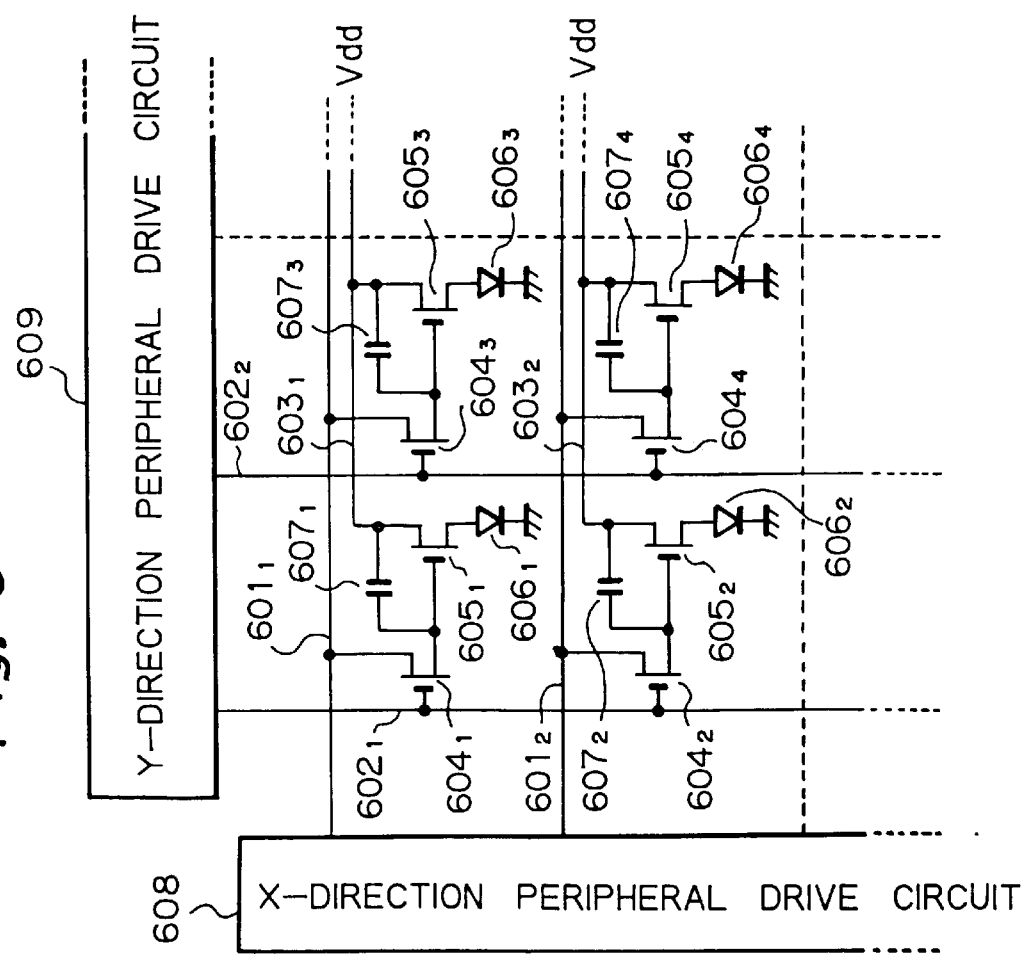
FIG. 6 shows a circuit diagram of an organic EL display apparatus according to the present invention.

As shown in FIG. 6, the organic EL display device according to the present invention is constituted by X-direction signal lines $601_1$, $601_2$, . . . , Y-direction signal lines $602_1$, $602_2$, . . . , power supply lines (Vdd) $603_1$, $603_2$, . . . , switching thin film transistors $604_1$, $604_2$, $604_3$, $604_4$, . . . , current control thin film transistors $605_1$, $605_2$, $605_3$, $605_4$, . . . , organic EL elements $606_1$, $606_2$, $606_3$, $606_4$, . . . , capacitors $607_1$, $607_2$, $607_3$, $607_4$, . . . , a X-direction peripheral drive circuit 608 and a Y-direction peripheral drive circuit 609 and the like.

Each of the pixels of the organic EL display device is specified by one of the X-direction signal lines $601_1$, $601_2$, . . . , and one of the Y-direction signal lines $602_1$, $602_2$, . . . .

For example, if a signal corresponding to picture data is applied to the X-direction signal line $601_2$ and Y-direction scanning signal is applied to the Y-direction signal line 6011, the switching thin film transistor $604_2$ in the specified pixel turns on. Consequently, the current control thin film transistor $605_2$ controls current flowing from the power supply line $603_2$ into the organic EL element $606_2$ in accordance with the picture data causing corresponding light emission from this EL element $606_2$.

Many widely different embodiments of the present invention may be constructed without departing from the spirit and scope of the present invention. It should be understood by those skilled in the art that the present invention is not limited to the specific embodiments described in the specification, except as defined in the appended claims.

What is claimed is:

1. An electroluminescent display device comprising:
   a substrate having an insulating surface;
   a thin film transistor formed over said substrate, said thin film transistor comprising a semiconductor island including source, drain and channel regions, and a gate electrode adjacent to said channel region with a gate insulating film interposed therebetween;
   a first interlayer insulating film formed over said thin film transistor and said substrate;
   an opening formed in said first interlayer insulating film to define a pixel region of said electroluminescent display device;
   a pixel electrode electrically connected to the drain of said thin film transistor and formed in at least said opening of the first interlayer insulating film,
   an electroluminescence layer formed on said pixel electrode; and
   a counter electrode formed on said electroluminescence layer.

2. The electroluminescent display device according to claim 1 further comprising a second interlayer insulating film formed on said first interlayer insulating film.

3. The electroluminescent display device according to claim 1 wherein said electroluminescence layer comprises an organic electroluminescence layer.

4. The electroluminescent display device according to claim 1 wherein said electroluminescence layer comprises an inorganic electroluminescence layer.

5. An electroluminescent display device comprising:
   a substrate having an insulating surface;
   a thin film transistor formed over said substrate, said thin film transistor comprising a semiconductor island including source, drain and channel regions, and a gate electrode adjacent to said channel region with a gate insulating film interposed therebetween;
   a first interlayer insulating film formed over said thin film transistor and said substrate;
   an opening formed in said first interlayer insulating film wherein said opening does not overlap said semiconductor island of the thin film transistor;
   a pixel electrode electrically connected to the drain of said thin film transistor and formed in at least said opening of the first interlayer insulating film,
   an electroluminescence layer formed on said pixel electrode; and
   a counter electrode formed on said electroluminescence layer.

6. The electroluminescent display device according to claim 5 further comprising a second interlayer insulating film formed on said first interlayer insulating film.

7. The electroluminescent display device according to claim 5 wherein said electroluminescence layer comprises an organic electroluminescence layer.

8. The electroluminescent display device according to claim 5 wherein said electroluminescence layer comprises an inorganic electroluminescence layer.

9. An electroluminescent display device comprising:
   a substrate having an insulating surface:
   a thin film transistor formed over said substrate, said thin film transistor comprising a semiconductor island including source, drain and channel regions, and a gate electrode adjacent to said channel region with a gate insulating film interposed therebetween;

a drain electrode in contact with said drain region;

a first interlayer insulating film formed over said thin film transistor, said drain electrode and said substrate;

a wiring formed on said first interlayer insulating film and electrically connected to the source region of said thin film transistor through a contact hole of said first interlayer insulating film; and an opening formed in said first interlayer insulating film to expose a portion of said drain electrode;

a pixel electrode formed in said opening and connected to said exposed portion of the drain electrode;

an electroluminescence layer formed on said pixel electrode; and a counter electrode formed on said electroluminescence layer.

10. The electroluminescent display device according to claim 9 wherein said drain electrode comprises a first layer comprising a metal which directly contacts said drain region and a second layer comprising titanium nitride which directly contacts said pixel electrode, said metal selected from the group consisting of tungsten, molybdenum, tantalum, titanium and nickel.

11. The electroluminescent display device according to claim 9 further comprising a second interlayer insulating film formed on said first interlayer insulating film.

12. The electroluminescent display device according to claim 9 wherein said electroluminescence layer comprises an organic electroluminescence layer.

13. The electroluminescent display device according to claim 9 wherein said electroluminescence layer comprises an inorganic electroluminescence layer.

* * * * *